United States Patent [19]
Yu

[11] Patent Number: 6,033,588
[45] Date of Patent: Mar. 7, 2000

[54] METHOD FOR IMPROVING DIFFERENTIAL ETCHING RATE OF A METALLIC LAYER

[75] Inventor: Chia-Chieh Yu, Taipei, Taiwan

[73] Assignee: United Semiconductor Corp., Taiwan

[21] Appl. No.: 09/000,966

[22] Filed: Dec. 30, 1997

[30] Foreign Application Priority Data

Oct. 20, 1997 [TW] Taiwan .................................. 86115424

[51] Int. Cl.⁷ .............................. B44C 1/22; C03C 25/06
[52] U.S. Cl. ................................ 216/72; 216/39; 216/58; 216/67; 216/77; 216/78; 216/79
[58] Field of Search .................... 216/39, 58, 67, 216/72, 77, 78, 79

[56] References Cited

U.S. PATENT DOCUMENTS

| | | | |
|---|---|---|---|
| 4,901,129 | 2/1990 | Hynecek | 357/30 |
| 4,954,459 | 9/1990 | Avanzino et al. | 437/228 |
| 5,609,922 | 3/1997 | McDonald | 427/447 |
| 5,653,812 | 8/1997 | Petrmichl et al. | 118/723 |
| 5,772,906 | 6/1998 | Abraham | 216/72 |

*Primary Examiner*—Samuel A. Acquah
*Attorney, Agent, or Firm*—Rabin & Champagne PC

[57] ABSTRACT

A method for improving the differential etching rate of forming vias in a metallic layer by the addition of a nitrogen plasma processing operation into the conventional metal etching operation. The nitrogen plasma processing operation facilitates the formation of aggregates through a chemical reaction between gaseous nitrogen and metal. The aggregates are able to lower the etching rate of metal in such a way that its effect on a wide-open via is more than on a narrow-dense via. Hence, microloading effect on the etching rate is greatly improved.

23 Claims, 4 Drawing Sheets

METHOD FOR IMPROVING DIFFERENTIAL ETCHING RATE OF A METALLIC LAYER

BACKGROUND OF THE INVENTION

1. Field of Invention

The present invention relates to a metal etching process. More particularly, the present invention relates to a method for improving the differential etching rate of metallic vias caused by geometric effects.

2. Description of Related Art

In semiconductor manufacture, there are two main methods of forming metallic conducting lines above a semiconductor substrate. One method of forming metallic conducting lines is to etch away portions of the dielectric layer above a substrate to form a trench, then depositing metal into the trench followed by removing the unwanted metal above the dielectric layer. Alternatively, a metallic layer is formed over the substrate first, then the metallic layer is etched to form conductive lines, and finally back filling a layer of dielectric material over the conductive lines. Plasma etching is now one of the most commonly used etching methods for forming, metallic lines. Principally, plasma etching is a method that utilizes plasma to break up the reactive gas molecules into reactive ions. These reactive ions then impinge upon films that are exposed to the plasma, and thereupon the ions will react chemically with the film material. The compound generated by ion bombardment and chemical reaction is quite volatile, and can be easily sucked away by the vacuum pump in a vacuum system, thereby layer upon layer of thin films are removed.

Microloading is always a major problem that affects the etching rate of a metal etcher that uses high-density plasma. When vias of different widths are simultaneously etched using the same etcher, problems will generally arise. This is because it is much easier to etch a wide-open via than a narrow-dense via. In other words, a wide-open via has a higher etching rate than a narrow-dense via. This is referred to as the microloading effect. Due to a difference in etching rate, it often happens that when a wide-open via has etched to the required depth, the narrow-dense via has not quite reached the same target depth. On the other hand, if a longer period is given to etch the narrow-dense via until the required depth is reached, the wide-open via would have already etched past the required depth causing a condition of over-etch.

FIG. 1 is a cross-sectional view of an ideal metal etch structure. As shown in FIG. 1, a metallic layer 11 and a photoresist layer 12 are formed over a substrate 10, then a pattern is formed in the photoresist layer 12 to expose the desired etching locations. Some etching locations are wide for etching a wide via 13a, while others are narrow for etching a narrow via 14a. Yet, the desired etching depth h of all those vias is the same. However, when the actual etching is performed, different vias will have different etching rates. Etching will be much easier for a wide via 13a than a narrow via like 14a. Hence, the etching rate for the wide via 13a will be much higher than the narrow via 14a. The result of etching is referred to in FIGS. 2A and 2B. FIG. 2A is a cross-sectional view showing the structure after the wide via has attained the required etching depth h. Because the etching rate of the narrow via 14a is smaller than the wide via 13a, the narrow via 14a has only etched to a depth of h1 when the wide via 13a has reached a depth h, where h is greater than h1. On the other hand, FIG. 2B is a cross-sectional view showing the structure after the narrow via has attained the required etching depth h. Because the etching rate of the narrow via 14a is smaller than the wide via 13a, a much longer etching time is required to reach the depth h. Therefore, by the time the narrow via 14a has etched to the depth h, the wide via 13a would have over-etched to a depth h2, where h2 is greater than h.

Such differences in the etching rate of metal not only affects the production of vias, but can also lead to a tapering cross-section as shown in FIG. 3 due to insufficient selectivity between metal and photoresist. FIG. 3 is a cross-sectional view showing the structure obtained by etching whose etching selectivity ratio of metal/photoresist is low. When the etching selectivity ratio of metal/photoresist is low, as the metal is being etched in an etching operation, the photoresist layer will also be simultaneously etched, and the result are vias 13b and 14b having a tapering cross-section.

In light of the foregoing, there is a need in the art to provide a better metal etching process.

SUMMARY OF THE INVENTION

Accordingly, the present invention is directed to provide a method for improving the differential etching rate of different size vias in metallic layer. The method utilizes a compound formed by the reaction of etching metal with gaseous nitrogen. This compound serves to lower the etching rate of metal in a manner such that some of the original differences in etching rate are reversed. Consequently, both the narrow and wide vias are etched to almost equal depths in the same etching operation, and effectively reducing the microloading effect.

To achieve these and other advantages and in accordance with the purpose of the invention, as embodied and broadly described herein, the invention provides a method for improving the differential etching rate of vias in a metallic layer. The method comprises the steps of providing a substrate, then forming a metallic layer and a photoresist layer sequentially over the substrate. Next, the photoresist layer is patterned to form a mask having openings for the subsequent etching of at least a narrow via and a wide via. Thereafter, a high-density plasma etching process is conducted for a period. After that, nitrogen plasma is added such that the nitrogen reacts with the metal inside the via to form an aggregate. Subsequently, the high-density plasma etching is resumed. Through the blockade by aggregate, the subsequent etching rate are changed somewhat so that the wide and the narrow vias are all etched to almost the same final depth.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
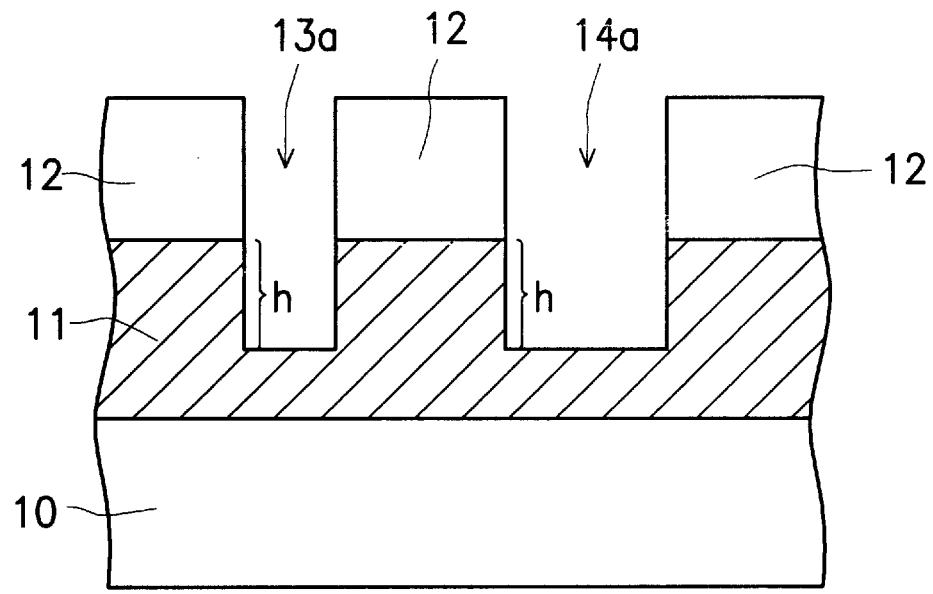
FIG. 1 is a cross-sectional view of an ideal metal etch structure.
Figure 2A:
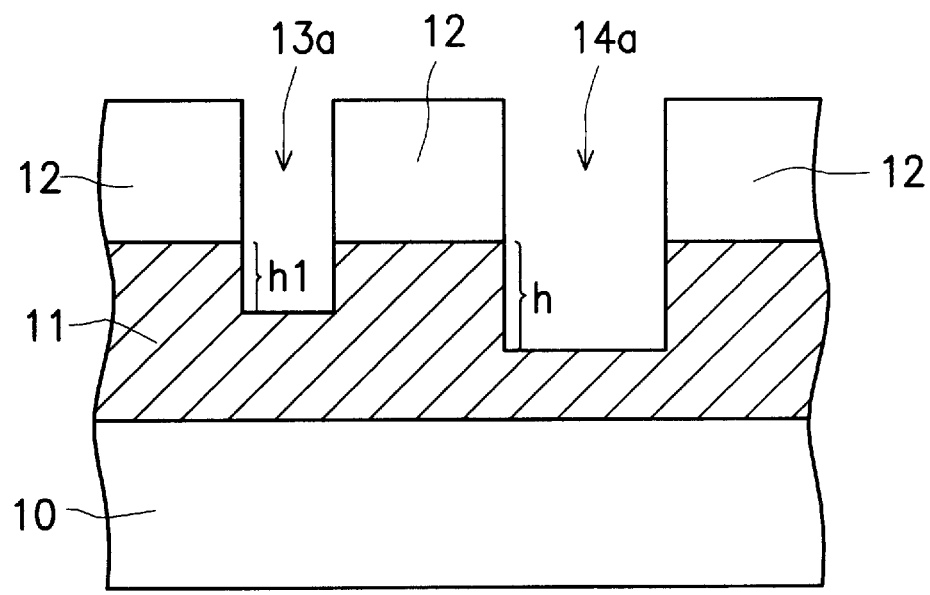
FIG. 2A is a cross-sectional view showing the structure after the wide via has attained the required etching depth h.
Figure 2B:
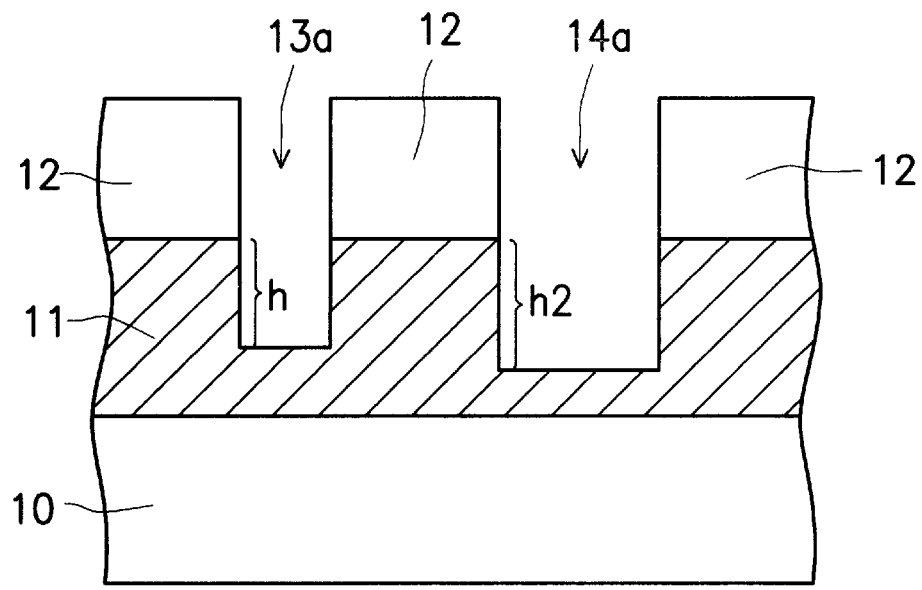
FIG. 2B is a cross-sectional view showing the structure after the narrow via has attained the required etching depth h.
Figure 3:
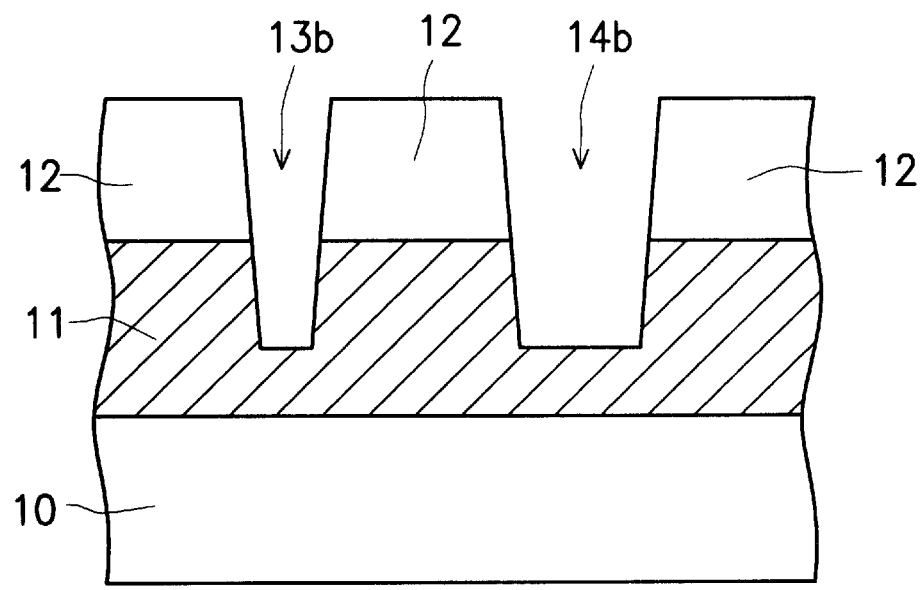
FIG. 3 is a cross-sectional view showing the structure obtained by etching whose etching selectivity ratio of metal/photoresist is low.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
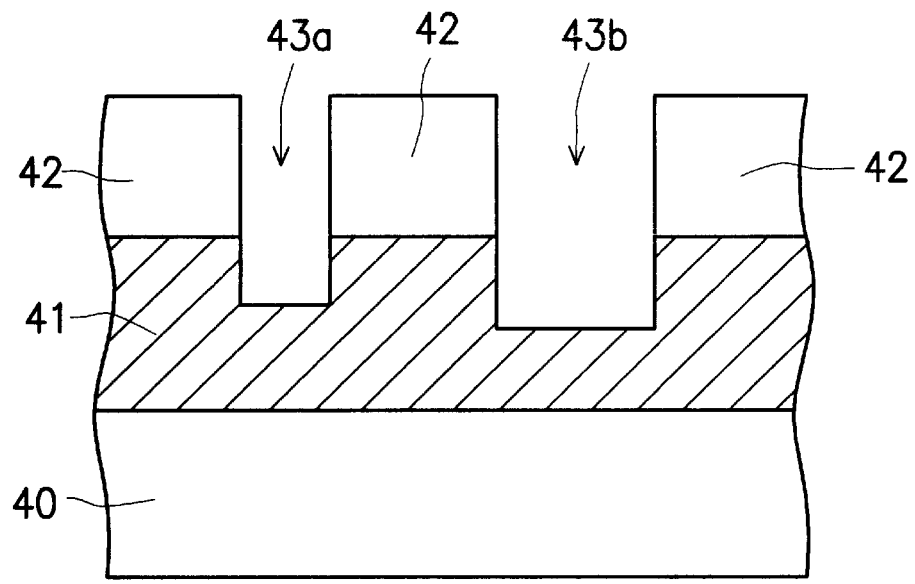
FIGS. 4A through 4C are cross-sectional views showing the progression of manufacturing steps for the etching of vias in a metal layer according to one preferred embodiment of this invention.
Figure 4B:
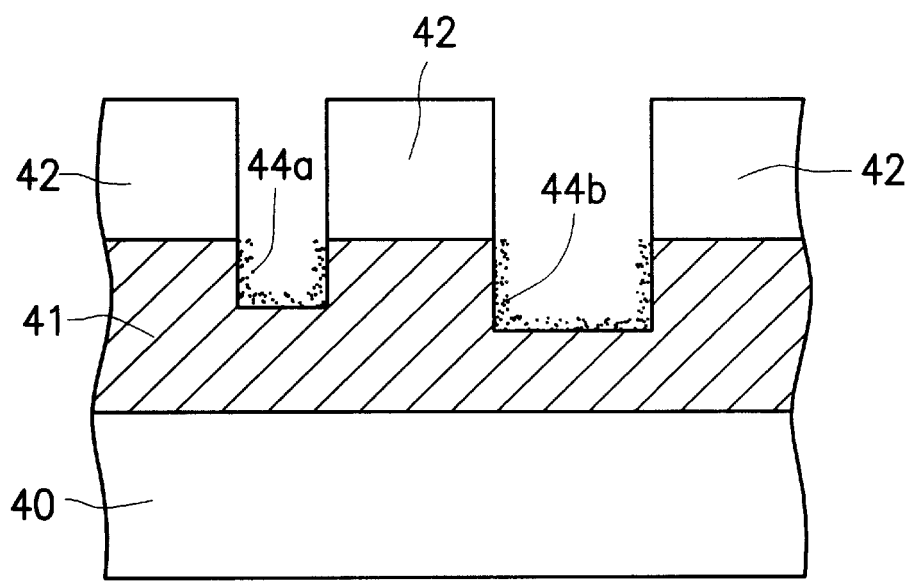
Figure 4C:
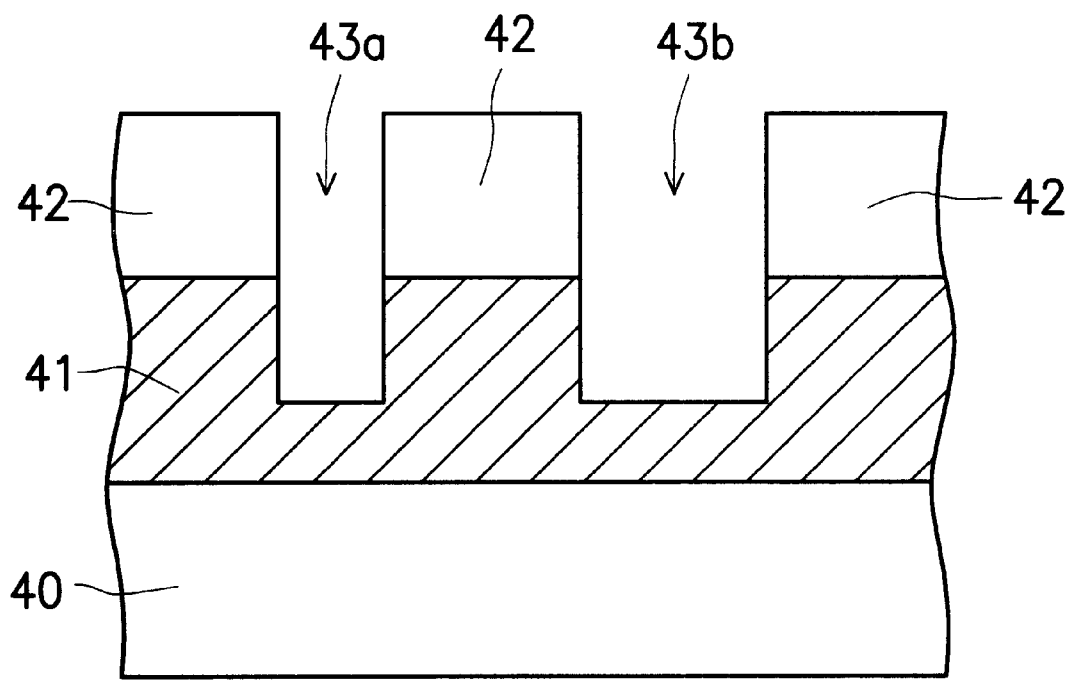

FIGS. 4A through 4C are cross-sectional views showing the progression of manufacturing steps for the etching of vias in a metal layer according to one preferred embodiment of this invention. First, as shown in FIG. 4A, a metallic layer 41 is formed over a substrate 40. The metallic layer can be aluminum, aluminum-copper alloy or aluminum-silicon alloy, for example. Next, a photoresist layer 42 is formed over the metallic layer 41, and then the photoresist layer 42 is patterned to form a mask having a narrow-dense via 43a and a wide-open via 43b. Subsequently, a high-density plasma etching operation is performed. The wide-open via will be easier to etch than the narrow-dense via. In other words, the wide-open via has a higher etching rate than the narrow-dense via, and so different via depths are etched out as shown in FIG. 4A. This is the so-called microloading effect.

Next, as shown in FIG. 4B, an additional gaseous plasma etching operation is carried out using, for example, nitrogen plasma. The gaseous nitrogen ($N_2$) in the plasma etching operation will react with the aluminum inside the via to form aluminum nitride ($AlN_x$). The aluminum nitride is able to slow the etching operation a little and lowering its etching rate. Furthermore, the aluminum nitride will form aggregates 44a and 44b on the sides of the via functioning as protective sidewalls.

Next, as shown in FIG. 4C, the high-density plasma etching operation is resumed. Although aggregates are also formed in a direction perpendicular to the incoming plasma, the aggregate will be removed by the direct bombardment of plasma during the etching operation. Hence, the plasma-etching rate in a vertical direction is far higher than plasma-etching rate in the horizontal direction, and thereby further enhancing the anisotropic etching property. The effect of aggregates on the etching rate is more obvious for wide-open via than narrow-dense via. Accordingly, the original situation of the wide-open via having a higher etching rate than the narrow-dense via will be reversed. A lower etching rate for the wide-open via helps to bring the differences in depth of etch between a wide-open via and a narrow-dense via closer together.

The purpose of adding gaseous nitrogen into the reactive etching gases is to form a protective material on the sidewalls, and to enhance the anisotropic etching effect. During aluminum etching operation, main reactive gases that participate in the etching operation includes boron chloride and chlorine gas. These gases combine with the aluminum atom to form a volatile compound aluminum trichloride ($AlCl_3$), thereby achieving the required etch removal. At present, the reactive gases that are used in metal etching include boron trichloride/chlorine/nitrogen ($BCl_3/Cl_2/N_2$). From a chemical reaction point of view, the reaction of nitrogen with aluminum to form aluminum nitride must compete with other gaseous reactant such as boron trichloride and chlorine. Therefore, the proportion of nitrogen that reacts with aluminum to form nitride is low, and incapable of improving the microloading problem. ! By the introduction an intermediate nitrogen plasma operation, probability for nitrogen to react with aluminum is artificially increased. With the etching rate of a wide-open via now lowered, the microloading effect is greatly reduced.

The effect of introducing an intermediate nitrogen plasma operation in this invention is compared with the conventional etching method. The results are shown in table 1 and table 2. In table 1, two processes are compared. The first process is to etch a wafer continuously for about 60 minutes using a conventional etching method. The second process is to etch the wafer for about 20 minutes using a conventional method, then etching using a nitrogen plasma for about 7 minutes, and subsequently, resuming the conventional etching method again for another 40 minutes. The result of etching is shown below:

TABLE 1

| METHOD\LINEWIDTH | 1 Micron (Microloading) | 0.45 Micron (Microloading) |
|---|---|---|
| Conventional Method | 9.4% | 35.7% |
| rtb Conventional Method + Nitrogen Plasma | −3.7% | 25.3% |

In table 2, two processes are again compared. The first process is to etch a wafer continuously for about 30 minutes using a conventional etching method. The second process is to etch the wafer for about 10 minutes using a conventional method, then etching using a nitrogen plasma for about 7 minutes, and subsequently, resuming the conventional etching method again for another 20 minutes. The result of etching is shown below:

TABLE 2

| METHOD\LINEWIDTH | 1 Micron (Microloading) | 0.45 Micron (Microloading) |
|---|---|---|
| rdrbConventional Method | <3% | 20.7% |
| rw10 Conventional Method + Nitrogen Plasma | <3% | 14.3% |

From Table 1 and Table 2, the improvement towards the microloading effect due to the introduction of an intermediate nitrogen plasma operation is obvious.

As a summary, the characteristic of this invention is the incorporation of a nitrogen plasma process into the conventional metal etching operation. The metallic layer is etched using a conventional method and conventional reactive gases first, then a nitrogen plasma operation is preformed. Next, the conventional etching operation is continued, making use of the aggregates formed by the reaction between nitrogen and metal during the nitrogen plasma operation to lower the metal etching rate. The aggregates have more effect on the etching rate of wide-open via than narrow-dense via, thereby etching out vias that have approximately the same depth. Hence, microloading effect on the etching rate is greatly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming one or more wide-open via and one or more narrow-dense via in a metallic layer such that their differential etching rate is minimized, the method comprising the steps of:

providing a substrate;

forming a metallic layer over the substrate;

forming a pattern on the metallic layer for subsequent etching of a wide-open via or a narrow-dense via;

performing an etching operation using reactive gases;

cutting off the reactive gases and passing in a gaseous plasma; and resuming the etching operation by passing in the reactive gases again.

2. The method of claim 1, wherein the step of forming the metallic layer includes depositing aluminum.

3. The method of claim 1, wherein the step of forming the metallic layer includes depositing silicon-aluminum alloy.

4. The method of claim 1, wherein the step of forming the metallic layer includes depositing aluminum-copper alloy.

5. The method of claim 1, wherein the step of passing in the gaseous plasma includes passing in nitrogen plasma.

6. The method of claim 5, wherein the gaseous plasma reacts with the metallic layer to form aggregates.

7. The method of claim 6, wherein the aggregates are used for lowering the etching rate of reactive gases on metallic layer.

8. The method of claim 7, wherein the aggregates have a greater effect on the etching rate of the wide-open vias than the narrow-dense vias.

9. A method for forming one or more wide-open via and one or more narrow-dense via in a metallic layer such that their differential etching rate is minimized, the method comprising the steps of:

providing a substrate;

forming a metallic layer over the substrate;

forming a photoresist layer over the metallic layer;

patterning the photoresist layer to form a mask with openings exposing the etching locations for wide-open vias and narrow-dense vias;

performing an etching operation using reactive gases;

cutting off the reactive gases and passing in a gaseous plasma;

resuming the etching operation by passing in the reactive gases again; and removing the photoresist layer.

10. The method of claim 9, wherein the step of forming the metallic layer includes depositing aluminum.

11. The method of claim 9, wherein the step of forming the metallic layer includes depositing silicon-aluminum alloy.

12. The method of claim 9, wherein the step of forming the metallic layer includes depositing aluminum-copper alloy.

13. The method of claim 9, wherein the step of passing in the gaseous plasma includes passing in nitrogen plasma.

14. The method of claim 13, wherein the gaseous plasma reacts with the metallic layer to form aggregates.

15. The method of claim 14, wherein the aggregates are used for lowering the etching rate of reactive gases on metallic layer.

16. The method of claim 15, wherein the aggregates have a greater effect on the etching rate of the wide-open vias than the narrow-dense vias.

17. A method for forming one or more wide-open via and one or more narrow-dense via in a metallic layer such that their differential etching rate is minimized, the method comprising the steps of:

providing a substrate;

forming a metallic layer over the substrate;

forming a photoresist layer over the metallic layer;

patterning the photoresist layer to form a mask with openings exposing the etching locations for wide-open vias and narrow-dense vias;

performing an etching operation using reactive gases;

cutting off the reactive gases and passing in a nitrogen plasma;

resuming the etching operation by passing in the reactive gases again, and removing the photoresist layer.

18. The method of claim 17, wherein the step of forming the metallic layer includes depositing aluminum.

19. The method of claim 17, wherein the step of forming the metallic layer includes depositing silicon-aluminum alloy.

20. The method of claim 17, wherein the step of forming the metallic layer includes depositing aluminum-copper alloy.

21. The method of claim 17, wherein the nitrogen plasma reacts with the metallic layer to form aggregates.

22. The method of claim 21, wherein the aggregates are used for lowering the etching rate of reactive gases on metallic layer.

23. The method of claim 22, wherein the aggregates have a greater effect on the etching rate of the wide-open vias than the narrow-dense vias.

* * * * *